United States Patent [19]

Platzer et al.

[11] Patent Number: 5,534,373
[45] Date of Patent: Jul. 9, 1996

[54] PEEL-APART PROCESS FOR THE PRODUCTION OF A COLORED IMAGE AND IMAGED PRODUCT PRODUCED THROUGH THE PROCESS

[75] Inventors: Stephan J. W. Platzer, Califon, N.J.; Andrea Buchmann, Wiesbaden; Gerhard Buhr, Königstein, both of Germany

[73] Assignee: Agfa-Gevaert AG, Leverkusen, Germany

[21] Appl. No.: 424,800

[22] Filed: Apr. 19, 1995

Related U.S. Application Data

[62] Division of Ser. No. 288,323, Aug. 10, 1994.

[30] Foreign Application Priority Data

Aug. 26, 1993 [DE] Germany .................. 43 28 676.3

[51] Int. Cl.$^6$ .................................................. G03F 7/34
[52] U.S. Cl. .................. 430/15; 430/14; 430/143; 430/253; 430/254; 430/292; 430/293
[58] Field of Search .................................. 430/253, 259, 430/14, 15, 143, 254, 292, 293

[56] References Cited

U.S. PATENT DOCUMENTS

| 4,923,780 | 5/1990 | Taylor, Jr. ................ 430/257 |
| 5,053,310 | 10/1991 | Platzer ................... 430/143 |
| 5,108,868 | 4/1992 | Platzer ................... 430/143 |

FOREIGN PATENT DOCUMENTS

| 0031566 | 7/1981 | European Pat. Off. . |
| 0451736 | 10/1991 | European Pat. Off. . |
| 0514186 | 11/1992 | European Pat. Off. . |
| WO93/15438 | 8/1993 | WIPO . |

*Primary Examiner*—Charles L. Bowers, Jr.
*Assistant Examiner*—Christopher G. Young
*Attorney, Agent, or Firm*—Foley & Lardner

[57] ABSTRACT

A photosensitive material comprising (A) a flexible transparent film support, (B) a colored photosensitive layer which contains an organic binder (B1) a dye or a colored pigment (B2), a compound (B3), which forms a strong acid on exposure to radiation, and a compound (B4) which has at least one group cleavable by the acid, and (C) an adhesion-promoting layer which contains a thermoplastic polymer which has a softening temperature in the range from 40° to 200° C., wherein the adhesion ($a_1$) of the unexposed photosensitive layer (B) to the adhesion-promoting layer (C) is less than the adhesion ($a_3$) of the unexposed photosensitive layer (B) to the film support (A) and than the cohesions of the layers (B) and (C), and the adhesion ($a_3'$) of the exposed photosensitive layer (B) to the film support (A) is less than the adhesion ($a_1'$) of the exposed photosensitive layer (B) to the adhesion-promoting layer (C) and than the cohesions of the adhesion-promoting layer (C) and of the exposed photosensitive layer (B) is useful for the production of a colored image, in particular, is useful in a color proofing method for multicolor printing, which process gives images having high resolution.

20 Claims, No Drawings

PEEL-APART PROCESS FOR THE PRODUCTION OF A COLORED IMAGE AND IMAGED PRODUCT PRODUCED THROUGH THE PROCESS

This application is a divisional of application Ser. No. 08/288,323 filed Aug. 10, 1994, allowed.

BACKGROUND OF THE INVENTION

1. Field of the Invention

The present invention relates to a photosensitive material which is suitable for the production of colored images, in particular for color proofing for multicolored printing. It also relates to a process for the production of a colored image, in particular a color proofing method, in which a photosensitive material comprising a transparent film support, a colored photosensitive layer and a thermoplastic adhesion-promoting layer is laminated with an image-receiving sheet, exposed imagewise through the film support and developed into the image by peeling off the film support together with the unexposed parts of the colored photosensitive layer. This type of development is known as "peel-apart" development. A multicolored image can be built up from a plurality of images in primary colors obtained in this manner.

2. Description of Related Art

Materials of the above-mentioned general generic type are described, for example, in U.S. Pat. No. 5,108,868. There, a photosensitive material based on diazonium salts is used, the resulting image in primary colors must be transferred again to a final image-receiving material, and the further images in primary colors must be laminated in register with the first one.

U.S. Pat. No. 4,923,780 describes a color proofing method in which an image in primary colors is produced from a colored photopolymerizable layer which contains an aromatic o-nitro compound which forms a polymerization inhibitor on exposure to shortwave UV radiation. Image reversal is achieved by imagewise exposure to shortwave UV radiation and exposure without the original to longwave UV radiation. The negative multicolored image can be obtained by lamination with an image-receiving material, exposure in register and development by peeling apart the individual images in primary colors.

EP-A 514 186 describes a negative-working color proofing method in which image development is effected by peeling apart. Here, image reversal is achieved from a photopolymerizable material by double lamination and double exposure, once with and once without an original.

SUMMARY OF THE INVENTION

It is an object of the present invention to provide a negative-working color proofing method and a photosensitive material which is suitable for this purpose and makes it possible to obtain the advantages of the processes known to date by simpler means. It is also an object of the present invention to provide a colored image produced by such an advantageous method.

In accordance with these and other objects, there has been provided a photosensitive material comprising (A) a flexible transparent film support, (B) a colored photosensitive layer on the support which contains an organic binder (B1) a dye or a colored pigment (B2), a compound (B3), which forms a strong acid on exposure to radiation, and a compound (B4) which has at least one group cleavable by the acid, and (C) an adhesion-promoting layer on the photosensitive layer which contains a thermoplastic polymer which has a softening temperature in the range from 40° to 200° C., wherein the adhesion ($a_1$) of the unexposed photosensitive layer (B) to the adhesion-promoting layer (C) is less than the adhesion (a3) of the unexposed photosensitive layer (B) to the film support (A) and less than each of the cohesions of the layers (B) and (C), and the adhesion ($a_3'$) of the exposed photosensitive layer (B) to the film support (A) is less than the adhesion ($a_1'$) of the exposed photosensitive layer (B) to the adhesion-promoting layer (C) and less than each of the cohesions of the adhesion-promoting layer (C) and of the exposed photosensitive layer (B).

In accordance with another aspect of the invention, there has been provided a process for the production of a colored image, comprising laminating a photosensitive material comprising (A) a flexible transparent film support, (B) a colored photosensitive layer on the support which contains an organic binder (B1) and a dye or a colored pigment (B2), a compound (B3), which forms a strong acid on exposure to radiation, and a compound (B4) which has at least one group cleavable by the strong acid, and (C) an adhesion-promoting layer on the photosensitive layer which contains a thermoplastic polymer which has a softening temperature in the range from 40° to 200° C.

on adhesion-promoting layer (C), under pressure and at elevated temperature, with an image-receiving sheet, exposing the obtained laminate imagewise through the film support (A), peeling off the film support together with the unexposed parts of the photosensitive layer (B) from the image-receiving sheet (D), wherein the adhesion ($a_1$) of the unexposed photosensitive layer (B) to the adhesion-promoting layer (C) is less than the adhesion ($a_2$) of the adhesion-promoting layer (C) to the image-receiving sheet (D) and less than the adhesion ($a_3$) of the unexposed photosensitive layer (B) to the film support (A) and less than each of the cohesions of the layers (B) and (C), and the adhesion ($a_3'$) of the exposed photosensitive layer (B) to the film support (A) is less than the adhesion ($a_2$) of the adhesion-promoting layer (C) to the image-receiving sheet (D) and less than the adhesion ($a_1'$) of the exposed photosensitive layer (B) to the adhesion-promoting layer (C) and less than each of the cohesions of the adhesion-promoting layer (C) and of the exposed photosensitive layer (B), wherein the photosensitive material used has a colored photosensitive layer (B) which contains a compound (B3), which forms a strong acid on exposure to radiation, and a compound (B4) which has at least one group cleavable by acid.

Further objects, features, and advantages of the present invention will become apparent from the detailed description of preferred embodiments which follows.

DETAILED DESCRIPTION OF THE PREFERRED EMBODIMENTS

The invention relates to a photosensitive material comprising (A) a flexible transparent film support, (B) a colored photosensitive layer which contains an organic binder (B1) and a dye or a colored pigment (B2), and (C) an adhesion-promoting layer which contains a thermoplastic polymer which has a softening temperature in the range from 40° to 200° C.

The adhesion ($a_1$) of the unexposed photosensitive layer (B) to the adhesion-promoting layer (C) being less than the adhesion ($a_3$) of the unexposed photosensitive layer (B) to the film support (A) and than the cohesions of the layers (B) and (C), and the adhesion ($a_3'$) of the exposed photosensitive layer (B) to the film support (A) being less than the adhesion ($a_1'$) of the exposed photosensitive layer (B) to the adhesion-promoting layer (C) and than the cohesions of the adhesion-promoting layer (C) and of the exposed photosensitive layer (B).

In the material according to the invention, the colored photosensitive layer (B) further contains a compound (B3), which forms a strong acid on exposure to radiation, and a compound (B4) which has at least one group cleavable by the acid.

In a preferred process for the production of a colored image according to the invention, the photosensitive material used is as described above and is particularly characterized by a colored photosensitive layer (B) which contains a compound (B3), which forms a strong acid on exposure to radiation, and a compound (B4) which has at least one group cleavable by acid.

The compound (B3) which forms a strong acid on exposure to radiation may be one or more of any known compounds which can release an acid upon exposure and is preferably a photosensitive organic halogen compound which contains more than one halogen atom at an aliphatic carbon atom or on an aromatic ring. Trihalomethyl compounds, for example trichloro- and tribromomethyl compounds, are especially effective, particularly those in which the trihalomethyl group is on a heterocyclic ring, for example, an s-triazine ring or a thiazoline ring. Suitable compounds of this type are described in U.S. Pat. Nos. 3,954,475; 4,189,323; and 4,619,998, each of which is hereby incorporated by reference.

Further compounds suitable as acid formers (B3) are sulfonic acid derivatives, such as esters, e.g., o-nitrobenzyl esters; amides and imides. Such compounds are described, inter alia, in Houlihan et al., in Macromolecules, Vol. 21, pages 2001–2006 (1988), EP-A 510 446 and U.S. Pat. Nos. 4,618,674 and 4,731,605, all of which are incorporated by reference.

Also useful as components (B3) are onium salts, such as described in J. Crivello, *Polym. Eng. Sci.*, 23 (1983), 953 which is incorporated by reference.

The acid-forming component (B3) is contained in the layer (B) in an amount effective to provide the desired results, which is generally 2 to 30, preferably 5 to 20, by weight of the layer weight.

The compound (B4) having at least one group cleavable by acid is likewise selected from known compounds. Generally, compounds having acid-cleavable C-O-C groups are used. Such compounds may be in particular orthocarboxylic esters, carboxamidoacetals, acetals or ketals. Enol ethers, N-acyliminocarbonates, ethers of tertiary alcohols and carboxylic or carbonic esters of tertiary alcohols, allyl alcohol or benzyl alcohols are also suitable.

Compounds having acid-cleavable C-O-Si groups, for example having silyl ether groups or silyl enol ether groups, also can be used for this purpose. Suitable acid-cleavable compounds are known and are described, inter alia, in U.S. Pat. Nos. 4,189,323, 4,311,782, 4,247,611, 4,250,247 and 4,248,957 and EP-A 510 448, all of which are incorporated by reference.

Among the acid-clearable compounds, preferred ones are those which are cleaved at as low as room temperature or at slightly elevated temperature. Ketals and especially orthocarboxylic esters are among these. The acid-cleavable compound is contained in the photosensitive layer in an effective amount which is generally an amount of 10 to 70, preferably 20 to 50, % by weight of the layer.

The organic polymeric binder (B1) is intended to impart homogeneity and strength to the layer. Suitable binders include any which impart these characteristics, including styrene/maleic anhydride and styrene/maleic half-ester copolymers, acrylate polymers and copolymers, polyamides, polyvinylpyrrolidones, cellulose derivatives, such as cellulose esters and cellulose ethers, phenol resins, polyvinyl esters and polyvinylacetals, e.g., polyvinylbutyral, polyvinylpropional or polyvinylformal. The amount of the binder is chosen to give the desired features and is generally 10 to 75, preferably 15 to 50, by weight, based on the weight of the solid layer.

The photosensitive layer contains, as color-imparting component (B2), a dye or preferably a colored pigment, which may be inorganic or organic. If dyes are used, they should preferably be lightfast. Any known dyes and/or pigments can be used and they are used alone or in combination to impart the desired coloring.

The dye or the colored pigment may be, for example, Permanent Yellow G (C.I. 21 095), Permanent Yellow GR (C.I. 21 100), Permanent Yellow DHG (C.I. 21 090), Permanent Ruby L6B (C.I. 15 850: 1), Permanent Pink F3B (C.I. 12 433), Hostaperm®Pink E (C.I. 73 915), Hostaperm®Red Violet ER (C.I. 46 500), Permanent Carmine FBB (C.I. 12 485), Hostaperm®Blue B2G (C.I. 74 160), Hostaperm®Blue A2R (C.I. 74 160) or Printex®25 (carbon black).

The pigments and dyes can, if required, be mixed in order to achieve the desired shade. They can be added to the photosensitive composition in any desired manner. For example, the pigments are generally dispersed together with a part of the binder in a suitable solvent and made into a paste. The mean particle size of the pigments is generally less than 1 μm, preferably less than 0.2 μm. Pigments are generally preferred to dyes. The dye and/or the colored pigment is contained in the layer in an effective amount which is generally from 10 to 50, preferably from 15 to 35, % by weight, based on the nonvolatile components of the layer.

The photosensitive layer may contain, as further components, inhibitors of the thermal decomposition of the acid-cleavable compounds, spectral sensitizers, plasticizers, oligomers, surface-active compounds, inert fillers, optical brighteners, antihalation agents, indicator dyes, hydrophilic compounds and residual solvents. The photosensitive layer may have any useful thickness and generally has a layer weight of 0.05 to 5, preferably 0.2 to 1, g/m$^2$.

The adhesion-promoting layer (C) contains a thermoplastic polymer and, if required, further components. This layer has the property of becoming tacky on heating to a temperature in the range of 60° to 130° C. Any desired adhesion-promoting layer (C) known in the art can be used.

Layer (C) is applied to the colored photosensitive layer (B) in any desired manner, for example, from solution or dispersion or by lamination. Suitable solvents for forming a solution which do not dissolve the layer (B) are saturated hydrocarbons, e.g., cyclohexane, n-hexane and n-heptane; water or mixtures of water with miscible organic solvents.

(Meth)acrylic acid copolymers having a high acid number or vinyl acetate/crotonic acid copolymers are useful in layer (C) and can be applied from aqueous, e.g., aqueous ammoniacal, solutions. Other polymer can be applied from aqueous dispersions, e.g., vinyl acetate polymers. Still other polymers are applied from a melt, e.g., ethylene/vinyl acetate copolymers. The adhesion-promoting layer also may be applied to the colored photosensitive layer (B) by a procedure in which the adhesion-promoting layer is produced on a temporary support and transferred from there to the photosensitive layer by lamination or peeling off the temporary support.

The adhesion-promoting layer also can be transferred from the temporary support to the image-receiving sheet (D) by lamination and peeling off. The photosensitive material comprising film support (A) and colored photosensitive layer (B) is then laminated on the adhesion-promoting layer present on the image-receiving sheet. Adhesion-promoting layers comprising (meth)-acrylate polymers and in particular vinyl acetate polymers having a softening range of 80°to 180° C. are particularly suitable for this method of transfer.

The thermoplastic polymer is contained in the adhesion-promoting layer in an effective amount, which is generally more than 50 % by weight. It typically has a softening temperature in the range from 40° to 200° C., in particular from 60° to 120° C. The adhesion-promoting layer may also contain UV absorbers, antistatic additives, inert fillers, optical brighteners, additives for increasing the tack and plasticizers. Suitable adhesion-promoting layers are described in U.S. Pat. No. 5,049,476 and in U.S. patent applications Ser. Nos. 08/027,540 (Hoe 92/K005) and 08/168,120 (Hoe 92/K071) each of which are incorporated by reference. The adhesion-promoting layer is generally thicker than 1 μm; and it generally has a layer weight of 2 to 30, preferably 4 to 12, g/m².

Any known film support may be used in the present invention. In particular, plastics films which are dimensionally stable on heating to about 60° to 130° C. are suitable as flexible transparent film supports (A) for the material according to the invention. Preferably, films of polyesters, polycarbonates, polyimides, and similar polymers are suitable for this purpose. Polyester films generally are preferred. The film support may have any desired thickness, for example, in the range from about 10 to 120 μm, preferably from 25 to 75 μm.

In order to improve the dimensional stability, the films are generally biaxially oriented and, if required, heat-set. The surface of the film may be smooth or matt, smooth films generally being preferred. The film support may be subjected to a treatment on the surface which prevents blocking, for example, by coating with a suitable bottom layer which contains finely-divided organic or, in particular, inorganic particles whose size, amount and refractive index are such that the transparency of the film is not adversely affected.

The image-receiving sheet (D) may comprise any suitable material which withstands the conditions of lamination and of peeling apart and which forms a suitable visual contrast to the transferred colored image. The material usually should be white. Plastics films, for example, pigmented polyester films, plastic-coated papers, for example, polyethylene-coated paper, wood, glass, metal and the like may be used. The material may be provided beforehand with an adhesion-promoting coating. A normal printing paper may also be used.

Lamination may be performed in any known manner and generally is effected by placing the photosensitive material with its adhesion-promoting layer on the receiving sheet and passing it together with this through the nip of two heated laminating rolls (above room temperature of about 20° C.) under sufficient pressure. The laminating temperature is usually in the range from 60° to 130° C., preferably 70° to 120° C. The rolls may be at the same temperature or at different temperatures; the laminating speed is usually between 10 and 100, preferably 20 to 60, cm/min.

The photosensitive layer is exposed to light in any known manner through the transparent film support.(A), before or after lamination. Exposure to light is usually effected under a screen color separation negative in a vacuum copying frame. Mercury vapor lamps are preferred as light sources. Light absorption filters may be used to reduce scattered light.

After lamination and exposure to light, the image is developed by uniformly peeling off the film support from the receiving sheet usually at room temperature. Special apparatuses for holding down or securing the receiving sheet during peeling are not required because only moderate peeling forces are necessary. The peeling angle usually should be at least 90°. During peeling, the unexposed parts of the photosensitive layer are removed with the film support and the exposed parts remain with the entire adhesion-promoting layer on the image-receiving sheet. A negative image of the original is thus obtained there.

Then, if desired, a further photosensitive material having a photosensitive layer (B) of a different color is laminated by means of an adhesion-promoting layer (C) with the first image in primary colors and exposed to light through the corresponding color separation in register with the first image in primary colors. The second image in primary colors is developed in the same manner by peeling off the film support. A third and fourth image in primary colors can be added in the same manner. Usually, a four-color image comprising the primary colors cyan, magenta, yellow and black is built up.

If desired, the surface of the finished image can be given a matt texture, for example, by embossing the glossy surface in contact with a rough surface, for example, a matt film. For this purpose, the image and matt film are passed together through a roll nip of a laminating apparatus. The surface texture can be determined by choosing a corresponding matt material. Finally, the finished image can be cured by exposure to a suitable light source, if necessary with heating. A protective layer, as described, for example, in U.S. Pat. No. 4,999,266 which is incorporated by reference, can also be laminated with the surface of the finished image. The finished image can also be transferred from a temporary support to a permanent support, as described in U.S. Pat. No. 5,192,630 which is hereby incorporated by reference.

The examples which follow illustrate preferred embodiments of the invention. The amounts are, in general, stated in parts by weight (pbw). Unless stated otherwise, ratios and percentages are to be understood as weight units.

EXAMPLE 1

One of the following coating solutions, for the primary colors cyan, yellow, magenta and black, was applied to each of four 50 μm thick biaxially oriented and heat-set polyethylene terephthalate films which had been provided with an antiblock treatment:

|  | Cyan pbw | Yellow pbw | Magenta pbw | Black pbw |
| --- | --- | --- | --- | --- |
| Polymeric orthoester* | 2.02 | 2.01 | 1.96 | 1.94 |
| 2-(4-Biphenylyl)-4,6-bis-trichloromethyl-s-triazine | 0.51 | 0.50 | 0.43 | 0.52 |
| Polyvinylformal Average molecular weight 80,000, 24% of vinyl alcohol units, 26% of vinyl acetate units and 50% of vinylformal units (Formvar ® 12/85) | 2.15 | 1.79 | 1.57 | 2.20 |
| Hostaperm ® Blue B2G (C.I. 74 160) | 0.90 | — | — | — |
| Permanent Yellow GR (C.I. 21 100) | — | 0.95 | — | — |
| Permanent Carmine FBB (C.I. 12 485) | — | — | 1.21 | — |
| Carbon black (Printex ® 25) | — | — | — | 1.30 |
| Tetrahydrofuran | 34.81 | 34.61 | 33.67 | 33.37 |
| 1-Methoxy-2-propanol | 23.58 | 23.45 | 22.81 | 22.61 |
| γ-Butyrolactone | 7.22 | 7.63 | 9.71 | 10.41 |
| Toluene | 1.87 | 1.86 | 1.81 | 1.79 |

*Prepared by reacting trimethyl orthoformate with 4-oxa-6,6-bis-hydroxymethyloctane-1-ol The colored pigments were introduced in the form of dispersions into the solutions. For this purpose, they were dispersed together with a part of the polyvinylformal in butyrolactone and milled to the desired particle size, i.e., a mean particle diameter of 0.1 μm. Before the coating procedure, each coating solution was thoroughly mixed. The coats were dried for 2 minutes at 70° C.; thereafter, the optical densities of the individual layers had the following values:

| | |
| --- | --- |
| Cyan | 1.3 |
| Yellow | 1.0 |
| Magenta | 1.4 |
| Black | 1.6 |

The layer weights were 0.5 g/m².

A solution for an adhesion-promoting layer, having the following composition, was applied to each of the colored layers:

| | pbw |
| --- | --- |
| Ammonium hydroxide (25%) | 8.5 |
| Sodium sulfite | 1.4 |
| Polyvinyl methyl ether (Lutonal ® M40) | 1.9 |
| 95:5 vinyl acetate/crotonic acid copolymer | 96.7 |
| Water | 520.0 |
| Ethanol | 43.0 |

After drying, the adhesion-promoting layers each had a weight of 6.5 g/m².

The cyan film was laminated at 105° C., on its adhesion-promoting layer, with a paper receiving sheet. The photosensitive material was then exposed through the film support, under a cyan color separation negative, to a 5000 W copying lamp. After exposure to light, the film support was peeled off from the receiving sheet, the unexposed parts of the colored layer adhering to the film support and the exposed parts remaining together with the total adhesion-promoting layer on the receiving sheet.

The yellow photosensitive color film was laminated in the same manner with the cyan image, then exposed to light under the corresponding yellow color separation and developed by peeling off the film support to give the yellow image. These process steps were repeated in a corresponding manner with the magenta and the black color film. An exact four-color reproduction of the original was obtained.

The dot reproduction was at least 2 to 99% in a screen of 60 lines per cm. The exposure times were between about 20 and 30 seconds.

EXAMPLE 2 to 9

Example 1 was repeated, but with different photoinitiators in the photosensitive layer. The photoinitiators, the position of their absorption maximum in nm and the extinction coefficient (E) at this wavelength are stated in the table below.

| Example | Photoinitiator | $\lambda_{max}$(μm) | E |
| --- | --- | --- | --- |
| 1 | 2-(4-Biphenylyl)-4,6-bistrichloro-methyl-s-triazine | 332 | 30,800 |
| 2 | 4,4'-Bis-[2,4-bistrichloromethyl-triazin-6-yl]-diphenyl ether | 331 | 50,500 |
| 3 | 2-(4-Ethoxyphenyl)-4,6-bistrichloro-methyl-s-triazine | 333 | 38,200 |
| 4 | 2-Styryl-4,6-bistrichloromethyl-s-triazine | 336 | 30,800 |
| 5 | 2-(3,4,5-Trimethoxyphenyl)-4,6-bis-trichloromethyl-s-triazine | 337 | 15,900 |
| 6 | 2-(3,4-Dimethoxyphenyl)-4,6-bistri-chloromethyl-s-triazine | 352 | 17,700 |
| 7 | 2-Fluoren-2-yl-4,6-bistrichloro-methyl-s-triazine | 371 | 37,800 |
| 8 | 2-(4-Styrylphenyl)-4,6-bistri-chloromethyl-s-triazine | 371 | 41,400 |
| 9 | 2-(4-Ethoxynaphth-1-yl)-4,6-bistri-chloromethyl-s-triazine | 388 | 25,000 |

EXAMPLE 10

Example 1 was repeated with the modification that the photosensitive mixtures were applied to the untreated side of 75 m thick polyester films. The dot reproduction was only 3 to 97% because exposure of the photosensitive layer to light was effected in this case through the thicker film.

EXAMPLE 11

Example 1 was repeated with the modification that the polymeric orthoester was replaced with a polyacetal which had been obtained by reacting 2-ethylbutyraldehyde with triethylene glycol. A multicolored image of a quality similar to that in Example 1 was obtained.

EXAMPLE 12

Example 1 was repeated, but the solvent mixture of tetrahydrofuran and 1-methoxy-2-propanol was replaced with the same amount of a mixture of butanone, 1-methoxy-2-propanol and 4-hydroxy-4-methyl-2-pentanone in a ratio of 35:20:25. The solutions obtained were stable to peroxide formation and gave a comparable multicolored image.

EXAMPLE 13

Example 1 was repeated, but the polyvinylformal was replaced with the same amount of a polyvinylbutyral which had a molecular weight of 70,000 to 80,000 and contained 71% of vinylbutyral units, 2% of vinyl acetate units and 27% of vinyl alcohol units. The force required for separating the film from the image-receiving material and hence for image development was slightly greater than in the case of the polyvinylformal from Example 1. The multicolored image obtained was essentially of the same quality.

EXAMPLE 14

Example 1 was repeated with the modification that the following solution for the adhesion-promoting layer was used:

31.7 parts by weight of vinyl pyrrolidone/vinyl acetate copolymer (1:1)

90.2 parts by weight of water 10.2 parts by weight of ethanol.

The result obtained was essentially the same as that in Example 1.

What is claimed is:

1. A process for the production of a colored image, comprising laminating the adhesion-promoting layer of a photosensitive material comprising (A) a flexible transparent film support;

(B) a colored photosensitive layer on the support which contains an organic binder (B1) and a dye or a colored pigment (B2), a compound (B3), which forms a strong acid on exposure to radiation, and a compound (B4) which has at least one group cleavable by the strong acid; and (C) an adhesion-promoting layer on the photosensitive layer which contains a thermoplastic polymer which has a softening temperature in the range from 40° to 200° C., under pressure and at a temperature above room temperature, with an image-receiving sheet (D), exposing the obtained laminate imagewise through the film support (A), whereby, compound (B3) forms a strong acid and compound (B4) is cleaved by the strong acid, developing the image by peeling off the film support together with the unexposed parts of the photosensitive layer (B) from the image-receiving sheet (D), such that the exposed parts of the photosensitive layer (B) remain O he adhesion promoting layer, wherein the adhesion ($a_1$) of the unexposed photosensitive layer (B) to the adhesion-promoting layer (C) is less than the adhesion ($a_2$) of the adhesion-promoting layer (C) to the image-receiving sheet (D) and less than the adhesion ($a_3$) of the unexposed photosensitive layer (B) to the film support (A) and less than each of the cohesions of the layers (B) and (C), and the adhesion ($a_3'$) of the exposed photosensitive layer (B) to the film support (A) is less than the adhesion (a2) of the adhesion-promoting layer (C) to the image-receiving sheet (D) and the adhesion ($a_1'$) of the exposed photosensitive layer (B) to the adhesion-promoting layer (C) and less than each of the cohesions of the adhesion-promoting layer (C) and of the exposed photosensitive layer (B).

2. A process as claimed in claim 1, wherein the steps of laminating, exposing to light, and peeling off the film support are repeated with at least one photosensitive material which contains a dye or pigment of a different color, on the same image-receiving sheet.

3. A process as claimed in claim 1, wherein the photosensitive material is laminated with the image-receiving sheet at a temperature in the range from 60° to 130° C.

4. A process as claimed in claim 1, wherein the adhesion-promoting layer (C) is first laminated to the image-receiving sheet (D), and the layer (B) and (A) are applied on layer (C).

5. A process as claimed in claim 1, wherein the adhesion-promoting layer (C) is first incorporated with layers (B) and (A) to form a photosensitive material and the layer (C) is then laminated to the image-receiving sheet (D).

6. A process as claimed in claim 1, which is a dry peel-apart process using no developer.

7. A process according to claim 1, wherein the produced image is given a matt texture.

8. A process as claimed in claim 1, wherein the compound (B3) contains at least one trihalomethyl group.

9. A process as claimed in claim 8, wherein compound (B3) contains a trihalomethyl group on a heterocyclic ring.

10. A process as claimed in claim 9, wherein the heterocyclic ring is a s-triazine ring.

11. A process as claimed in claim 1, wherein the group cleavable by acid that is present in compound (B4) is a C-O-C group.

12. A process as claimed in claim 1, wherein the group cleavable by acid that is present in compound (B4) is a C-O-Si group.

13. A process as claimed in claim 1, wherein the compound (B4) is an orthocarboxylic ester, carboxamidoacetal, acetal, or ketal.

14. A process as claimed in claim 1, wherein the surface of the transparent film support (A) on which the photosensitive layer (B) is present is pretreated to prevent blocking.

15. A process as claimed in claim 1, wherein the photosensitive layer (B) has a weight of 0.05 to 5 $g/m^2$.

16. A process as claimed in claim 1, wherein the adhesion-promoting layer (C) has a weight of 2 to 30 $g/m^2$.

17. A process according to claim 1, wherein the image-receiving sheet comprises paper.

18. A process according to claim 2, wherein a four-color image comprising cyan, magenta, yellow and black is built up by repeating the steps of laminating, exposing, and peeling off.

19. A colored image produced by the process of claim 1.

20. A colored image produced by the process of claim 2.

* * * * *

UNITED STATES PATENT AND TRADEMARK OFFICE
CERTIFICATE OF CORRECTION

PATENT NO. : 5,534,373
DATED : July 9, 1996
INVENTOR(S) : Stephan J. W. PLATZER et al.

It is certified that error appears in the above-indentified patent and that said Letters Patent is hereby corrected as shown below:

Column 2, line 9, contains a typographical error wherein "(a3)" should read --($a_3$)--

Column 4, line 5, "clearable" should read --cleavable--.

Column 5, line 6, "polymer" should read --polymers--.

Column 6, line 10, "." should be deleted.

Column 8, line 11, "EXAMPLE" should read --EXAMPLES--.

Col. 9, line 44, "0 he" should read --on the--; and line 54, "(a2)" should read --($a_2$)--

Signed and Sealed this

Thirty-first Day of December, 1996

Attest:

BRUCE LEHMAN

*Attesting Officer*     *Commissioner of Patents and Trademarks*